United States Patent
Cheng et al.

(10) Patent No.: US 8,836,318 B2
(45) Date of Patent: Sep. 16, 2014

(54) PROXIMITY ELECTRIC CURRENT SENSING DEVICE AND METHOD

(75) Inventors: Shih-Hsien Cheng, Kaohsiung (TW); Ming-Jhe Du, Tainan (TW); Lien-Yi Cho, Zhunan Township (TW)

(73) Assignee: Industrial Technology Research Institute, Hsinchu (TW)

( * ) Notice: Subject to any disclaimer, the term of this patent is extended or adjusted under 35 U.S.C. 154(b) by 218 days.

(21) Appl. No.: 13/329,542

(22) Filed: Dec. 19, 2011

(65) Prior Publication Data

US 2013/0106400 A1    May 2, 2013

(30) Foreign Application Priority Data

Nov. 2, 2011 (TW) .............................. 100140020 A

(51) Int. Cl.
*G01R 15/18* (2006.01)
*G01R 15/20* (2006.01)

(52) U.S. Cl.
CPC ....................................... *G01R 15/20* (2013.01)
USPC .............. 324/117 R; 324/117 H; 324/750.22; 324/750.19; 324/529; 324/263

(58) Field of Classification Search
USPC ........ 324/117 R, 117 H, 750.22, 750.19, 529, 324/263, 262, 260, 259, 252, 247, 246, 244, 324/243, 242, 212, 207.24, 207.23, 207.22, 324/207.21, 207.2, 207.13
See application file for complete search history.

(56) References Cited

U.S. PATENT DOCUMENTS

| | | | |
|---|---|---|---|
| 4,754,218 A * | 6/1988 | Wagner et al. ................. | 324/127 |
| 5,057,769 A | 10/1991 | Edwards | |
| 5,767,668 A | 6/1998 | Durand | |
| 6,184,672 B1 | 2/2001 | Berkcan | |
| 6,642,705 B2 | 11/2003 | Kawase | |
| 6,731,105 B1 * | 5/2004 | Hoyle et al. ............... | 324/117 R |
| 7,164,263 B2 | 1/2007 | Yakymyshyn et al. | |
| 7,525,308 B2 * | 4/2009 | Tsukada et al. ................ | 324/243 |

(Continued)

FOREIGN PATENT DOCUMENTS

TW    263050 B    10/2006

OTHER PUBLICATIONS

Taiwan Office Action and Search Report dated Oct. 24, 2013 in application No. 100140020.

(Continued)

*Primary Examiner* — Huy Q Phan
*Assistant Examiner* — Temilade S Rhodes-Vivour
(74) *Attorney, Agent, or Firm* — Maschoff Brennan

(57) ABSTRACT

A proximity electric current sensing device includes a main body, a first and second adjusting components, a first to third sensing units. The main body has a hole for a conducting wire to go through. The first and second adjusting components are disposed on a first and second sides of the main body respectively for adjusting a first and second positions of the conducting wire. The first to third sensing units are disposed on the main body and adjacent to a first to third sides of the conducting wire respectively for sensing a first to third magnetic fluxes of the conducting wire. The processing unit rotates the adjusting components to ensure the third sensing unit is right above the center of the conducting wire according to the first and second magnetic flux, estimates an installation position, and calculates an amount of an electric current according to the third magnetic flux.

15 Claims, 8 Drawing Sheets

(56) References Cited

U.S. PATENT DOCUMENTS

| | | | |
|---|---|---|---|
| 7,528,592 B2 | 5/2009 | Marchand | |
| 7,605,580 B2 * | 10/2009 | Strzalkowski | 324/117 H |
| 7,649,348 B2 | 1/2010 | Vilas | |
| 7,652,472 B2 * | 1/2010 | Kobayashi et al. | 324/253 |
| 7,759,931 B2 * | 7/2010 | Tsukada et al. | 324/235 |
| 2004/0080308 A1 | 4/2004 | Goto | |
| 2004/0201374 A1 * | 10/2004 | Kawase | 324/117 R |
| 2005/0156587 A1 | 7/2005 | Yakymyshyn et al. | |
| 2008/0303511 A1 | 12/2008 | Grno | |
| 2010/0109643 A1 | 5/2010 | Storkey | |
| 2010/0194384 A1 | 8/2010 | Hammerschmidt | |
| 2010/0207603 A1 | 8/2010 | Mcnulty | |
| 2010/0315095 A1 | 12/2010 | Younsi et al. | |

OTHER PUBLICATIONS

Leland, Eli S, "A New MEMS Sensor for AC Electric Current", SENSORS Conference, IEEE, 2010, pp. 1177-1182.

Sheiretov, Yanko, "Design and Modeling of Shaped-Field Magnetoquasistatic Sensors", Transactions of Magnetics, IEEE, vol. 42, No. 3, Mar. 2006, pp. 411-421.

Leland, Eli S, "Energy scavenging power sources for household electrical monitoring", The Sixth International Workshop on Micro and Nanotechnology for Power Generation and Energy Conversion Applications, Nov. 29-Dec. 1, 2006, Berkeley, U.S.A., pp. 165-168.

Dalessandro, Luca, "High-Performance Planar Isolated Current Sensor for Power Electronics Applications", Transactions on Power Electronics, IEEE, vol. 22, No. 5, Sep. 2007, pp. 1682-1692.

European Search Report for European Application No. 11194486.4, mailed Apr. 23, 2014.

* cited by examiner

PROXIMITY ELECTRIC CURRENT SENSING DEVICE AND METHOD

CROSS-REFERENCE TO RELATED APPLICATIONS

This non-provisional application claims priority under 35 U.S.C. §119(a) on Patent Application No(s). 100140020 filed in Taiwan, R.O.C. on Nov. 2, 2011, the entire contents of which are hereby incorporated by reference.

BACKGROUND

1. Technical Field

The disclosure relates to an electric current sensor, and more particularly to a proximity electric current sensing device.

2. Related Art

In the recent years, with the rapid development of industrial automation, the demand for control instruments with high reliability and high performance is growing constantly. Various sensors play an important role in monitoring of automation. An electric current sensor is essential for instrumental sensing and controlling or home automation industry.

Currently, electric current sensors can be divided into four categories based on principles: 1. Ohm's law—shunting resistance, 2. Faraday's law of induction—current transformer (CT) 3. magnetic field sensing—Hall element, and 4. Faraday's photoelectric effect—optical fiber current sensor. The first two are either for direct measurement or bulky, and thus they are not convenient to use. Hall element is small and light and has a feature of proximity measurement which makes it stand out among others. As for optical fiber current sensor, it is difficult to maintain and is structurally complicated and therefore is only for a narrow range of applications.

According to Ampere's principle, magnetic field is formed in the surrounding when electric current goes through a conductor. The intensity of magnetic field is in direct proportion to an electric current of the conductor and in inverse proportion to a distance to the conductor. Therefore, an amount of electric current passes through the conductor can be known by sensing the intensity of the magnetic field.

SUMMARY

A proximity electric current sensing device of the disclosure comprises a main body, a first adjusting component, a second adjusting component, a first sensing unit, a second sensing unit, a third sensing unit, and a processing unit. The main body has a hole for a conducting wire to go through the main body. The first adjusting component is disposed on a first side of the main body for adjusting a first position of the conducting wire. The second adjusting component is disposed on a second side of the main body for adjusting a second position of the conducting wire. The first sensing unit is disposed on the main body and adjacent to a first side of the conducting wire for sensing a first magnetic flux of the conducting wire. The second sensing unit is disposed on the main body and adjacent to a second side of the conducting wire for sensing a second magnetic flux of the conducting wire. The third sensing unit is disposed on the main body and adjacent to a third side of the conducting wire for sensing a third magnetic flux of the conducting wire. The processing unit is coupled to the first sensing unit, the second sensing unit, and the third sensing unit for determining a position of the conducting wire according to the first and second magnetic flux, and calculates an amount of electric current according to the third magnetic flux.

A proximity electric current sensing method of the disclosure includes the following steps: using the first sensing unit to sense the first magnetic flux of the conducting wire, wherein the first sensing unit is adjacent to the first side of the conducting wire; using the second sensing unit to sense the second magnetic flux of the conducting wire, wherein the second sensing unit is adjacent to the second side of the conducting wire; using the third sensing unit to sense the third magnetic flux of the conducting wire, wherein the third sensing unit is adjacent to the third side of the conducting wire; calculating the position of the conducting wire according to the first and second magnetic flux; and calculating the amount of electric current according to the third magnetic flux.

BRIEF DESCRIPTION OF THE DRAWINGS

The present disclosure will become more fully understood from the detailed description given herein below for illustration only, and thus are not limitative of the present disclosure, and wherein.

DETAILED DESCRIPTION

The inventors recognize that existing proximity electric current sensors mostly have a problem of big measurement error caused by installation position, which makes them inconvenient in applications, therefore proximity electric current sensor can be improved for better performance.

The disclosure provides a proximity electric current sensing device and method, by which a conducting wire's position can be precisely calibrated in order to reduce a measurement error of electric current.

Figure 1:
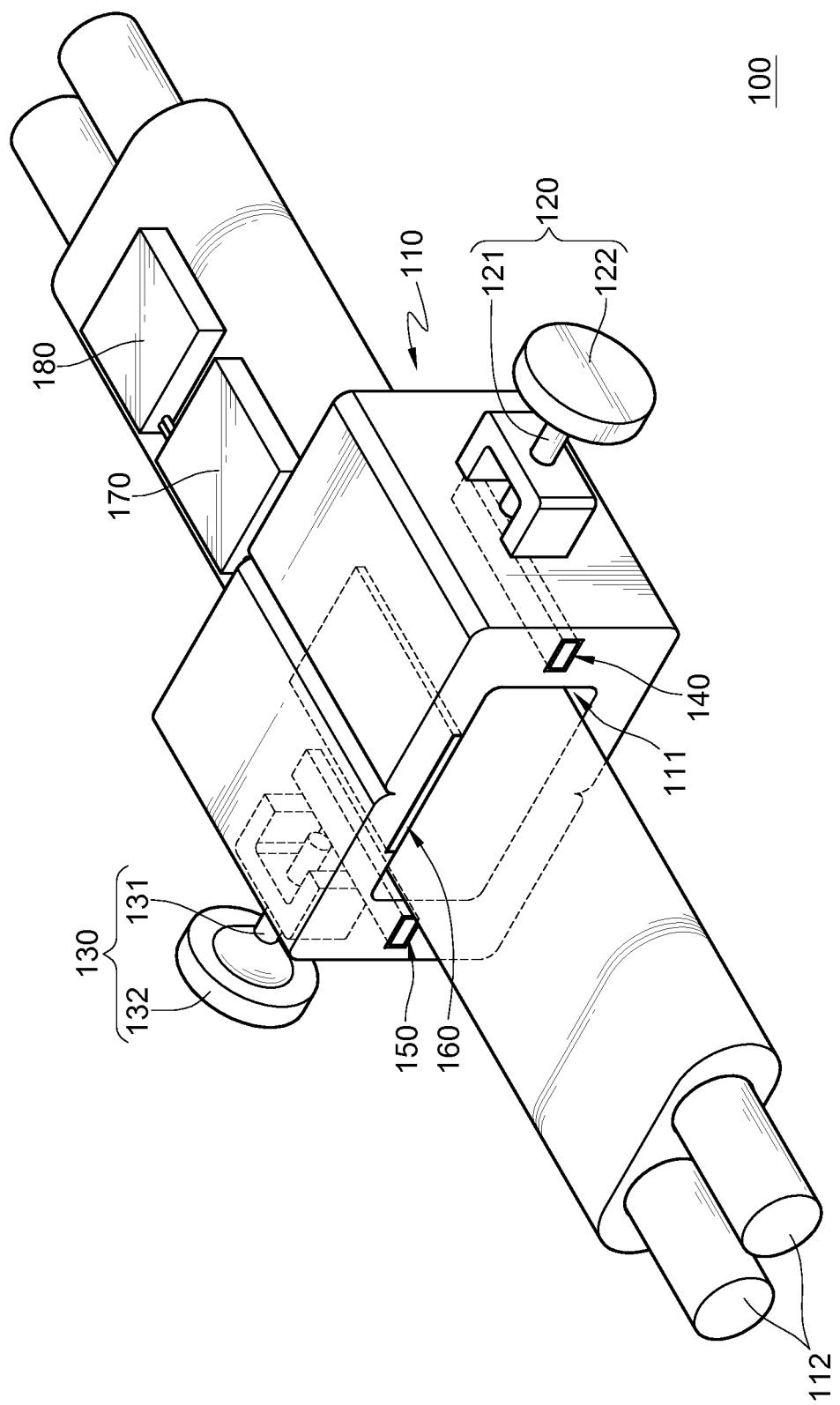
FIG. 1 is a perspective view of a proximity electric current sensing device of the disclosure.

FIG. 1 is a perspective view of a proximity electric current sensing device of the disclosure. A proximity electric current sensing device 100 comprises a main body 110, adjusting components 120 and 130, sensing units 140, 150 and 160, a processing unit 170, and a display unit 180. The main body 110 has a hole 111. The hole 111 is for a conducting wire 112 to go through the main body 110. In other words, users can have the conducting wire 112 go through the main body 110 through the hole 111, in order to measure an amount of electric current of the conducting wire 112. In the embodiment, the conduction wire 112 is a dual core power cord.

The adjusting component 120 is disposed on a first side of the main body 110 for adjusting a first position of the conducting wire 112. The adjusting component 130 is disposed on a second side of the main body 110 for adjusting a second position of the conducting wire 112. In this embodiment, the adjusting component 120 includes a bar 121 and a knob 122 connected to the bar 121, and the bar 121 performs a reciprocating motion by turning the knob 122, so that the bar 121 can be inserted into or out of the main body 110.

Furthermore, the adjusting component 130 includes a bar 131 and a knob 132. The knob 132 is connected to the bar 131, and the bar 131 performs a reciprocating motion by turning the knob 132, so that the bar 131 can be inserted into or out of the main body 110. Thereby, users can adjust the conducting wire 112 to move left or right horizontally with respect to the sensing unit 160 by turning the knobs 122 or 132, so that the conducting wire 112 can be adjusted to be disposed at a central position inside the main body 110 for measuring the amount of electric current of the conducting wire 112.

The sensing unit 140 is disposed on the main body 110 and adjacent to a first side of the conducting wire 112 for sensing a first magnetic flux of the conducting wire 112. The first magnetic flux sensed by the sensing unit 140 has a larger intensity if the conducting wire 112 is disposed nearer to the sensing unit 140. On the contrary, the first magnetic flux sensed by the sensing unit 140 has a smaller intensity if the conducting wire 112 is disposed further from the sensing unit 140.

The sensing unit 150 is disposed on the main body 110 and adjacent to a second side of the conducting wire 112 for sensing a second magnetic flux of the conducting wire 112. The second magnetic flux sensed by the sensing unit 150 has a larger intensity if the conducting wire 112 is disposed nearer to the sensing unit 150. On the contrary, the second magnetic flux sensed by the sensing unit 150 has a smaller intensity if the conducting wire 112 is disposed further from the sensing unit 150.

The sensing unit 160 is disposed on the main body 110 and adjacent to a third side of the conducting wire 112 for sensing a third magnetic flux of the conducting wire 112. The processing unit 170 is coupled to the sensing units 140, 150 and 160 for determining the position of the conducting wire 112 according to the first magnetic flux and the second magnetic flux, and calculates an amount of electric current flowed through the conducting wire 112 according to the third magnetic flux. Furthermore, the processing unit 170 estimates the installation position of the conducting wire 112, i.e., a distance between the conducting wire 112 and the sensing unit 160, according to the third magnetic flux. The display unit 180 is coupled to the processing unit 170 for displaying the position of the conducting wire 112 and the amount of electric current flowing through the conducting wire 112.

Accordingly, users can know if the position of the conducting wire 112 is offset according to the position of the conducting wire 112 displayed by the display unit 180, in order to observe if the sensing unit 160 is right above the center of the conducting wire 112, i.e., if the conducting wire 112 is at the central position inside the main body 110. If the conducting wire 112 is not at the central position inside the main body 110, then, the position of the conducting wire 112 is adjusted by the adjusting components 120 and 130 to ensure that the sensing unit 160 is right above the center of the conducting wire 112, so that a measurement error of electric current can be reduced.

Figure 2:
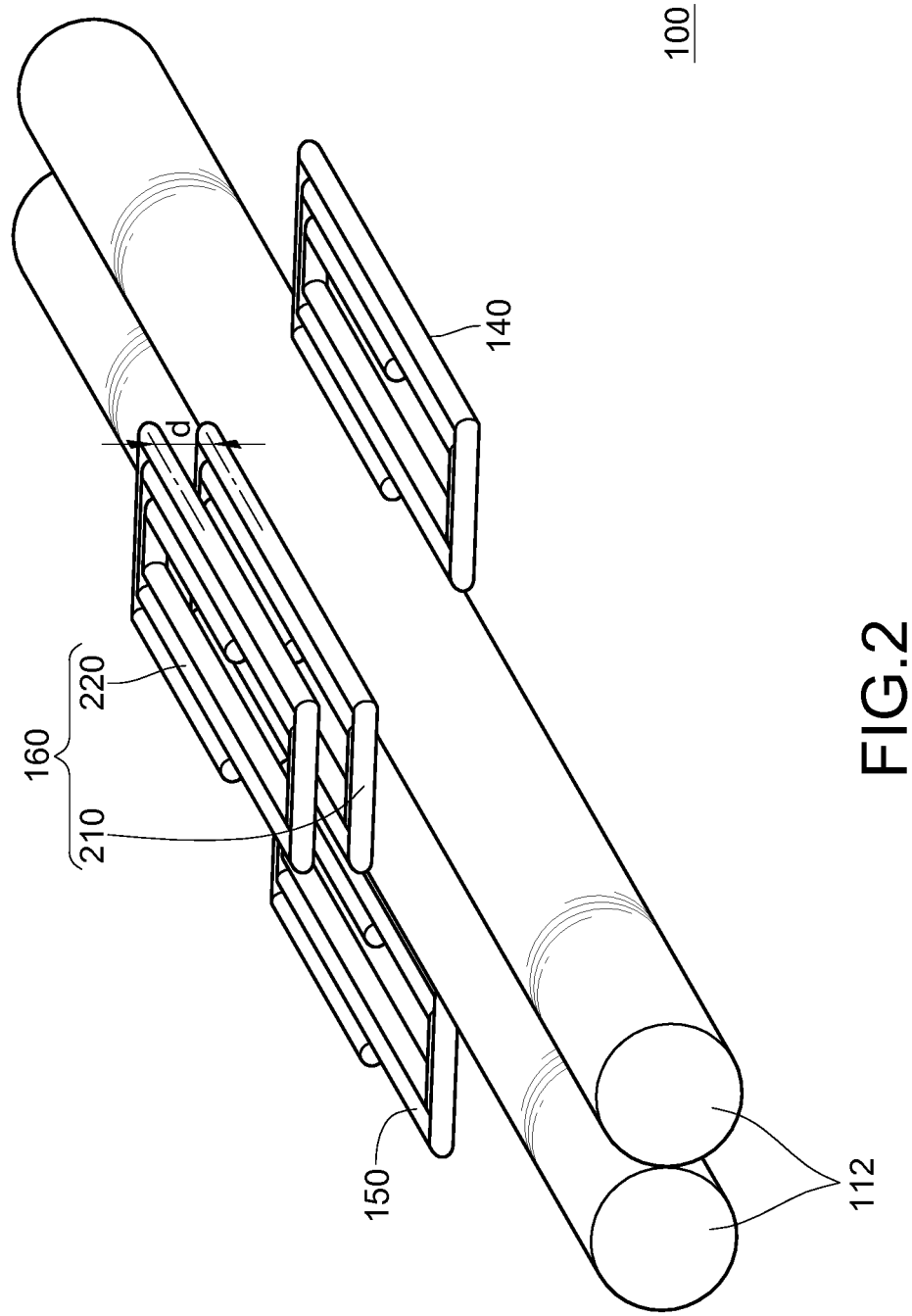
FIG. 2 is an illustration of a disposition of sensing units 140, 150 and 160 of the disclosure.

FIG. 2 illustrates a disposition of the sensing units 140, 150 and 160 of the disclosure. The sensing units 140 and 150 can be sensing coils. The sensing unit 160 further includes sensing coils 210 and 220. The sensing coil 210 is disposed on the main body 110 and adjacent to the third side of the conducting wire 112. The sensing coil 220 is disposed on the main body 110 at a preset distance d adjacent to the sensing coil 210. In this embodiment, the preset distance d is a known and fixed distance.

According to Ampere's law, when an electric current is flowing through a long and straight conducting wire, a toroidal magnetic field is generated in a proximity space. Based on the electric current of the conducting wire 112 sensed by the sensing unit 160 in this embodiment, a sensed voltage can be acquired according to Faraday's law of induction $$emf(v) = -\sum_{n=1}^{N} \frac{d\Phi_n}{dt} = \frac{\omega \mu_0 I \sin\omega t}{2\pi} \sum_{n=1}^{N} c_n \ln\left(\frac{b_n^2 + g^2}{a_n^2 + g^2}\right),$$

wherein $$\Phi_n = \int \vec{B} \cdot d\vec{A} = \frac{\mu_0 I \cos\omega t}{\pi} c_n \int_{a_n}^{b_n} \frac{x}{x^2 + g^2} dx$$

$$a_n = \frac{d}{2} - \frac{1}{2}[w_c - 2n \cdot w_d - 2(n-1) \cdot w_s]$$

$$b_n = \frac{d}{2} + \frac{1}{2}[w_c - 2n \cdot w_d - 2(n-1) \cdot w_s]$$

$$c_n = L - 2n \cdot w_d - 2(n-1) \cdot w_s,$$

$W_c$ is the width of the sensing coils 210 and 220, $W_d$ is the width of a winding wire of the sensing coils 210 and 220, $W_s$ is the distance between the winding wire of the sensing coil 210 and the winding wire of the sensing coil 220, $\mu_0$ is a magneto conductivity, I is the electric current of the conducting wire 122, g is the distance between the sensing coil 210 and the conducting wire 112, N is the number of coils of the winding wire of the sensing coils 210 and 220, Furthermore, by sensing the electric current of conducting wire 112 via the sensing coils 210 and 220 in this embodiment, an induced voltage can be acquired as follows:

$$\begin{cases} V_1 = \frac{\omega \mu_0 I \sin\omega t}{2\pi} \sum_{n=1}^{N} c_n \ln\left(\frac{b_n^2 + g^2}{a_n^2 + g^2}\right) \\ V_2 = \frac{\omega \mu_0 I \sin\omega t}{2\pi} \sum_{n=1}^{N} c_n \ln\left(\frac{b_n^2 + (g+d)^2}{a_n^2 + (g+d)^2}\right) \end{cases}$$

Wherein, parameters $a_n$, $b_n$, $c_n$, N, d are known parameters, while I and g are unknown numbers, $V_1$ is a voltage sensed by the sensing coil 210, $V_2$ is a voltage sensed by the sensing coil 220. Therefore, values of I and g can be acquired based on the abovementioned two equations, so that the amount of the electric current of the conducting wire 112 and the installation position of the conducting wire 112 (i.e. the distance between the conducting wire 112 and the sensing unit 160) can be precisely sensed by the proximity electric current sensing device 100 of this embodiment.

Figure 3:
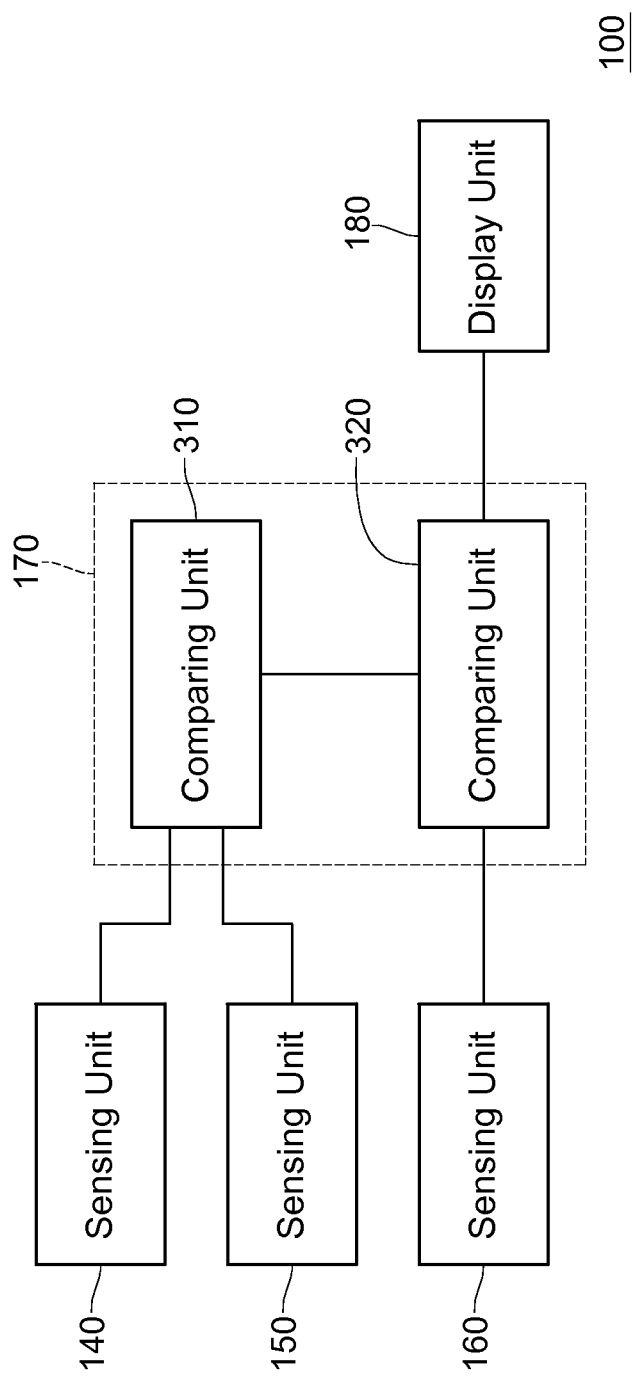
FIG. 3 is a block diagram of a circuit of a proximity electric current sensing device of the disclosure.

FIG. 3 is a block diagram of a circuit of a proximity electric current sensing device of the disclosure. The proximity electric current sensing device 100 comprises the sensing units 140, 150 and 160, the processing unit 170 and the display unit 180. Their coupling relationships can be referred to FIG. 3, which will not be mentioned again herein. The processing unit 170 includes a comparing unit 310 and a computing unit 320. The comparing unit 310 is coupled to the sensing units 140 and 150 for receiving and comparing the first magnetic flux and the second magnetic flux in order to generate a first comparison result. The computing unit 320 is coupled to the comparing unit 310 and the sensing unit 160 for determining the position of the conducting wire 112 according to the first comparison result, and calculating the amount of electric current flowing through the conducting wire 112 according to the third magnetic flux.

For example, when the first magnetic flux is larger than the second magnetic flux, the comparing unit 310 outputs, for example, a positive value as the first comparison result, then the computing unit 320 determines that the position of the conducting wire 112 is nearer to the sensing unit 140, which will be displayed on the display unit 180. When the first magnetic flux is smaller than the second magnetic flux, the comparing unit 310 outputs, for example, a negative value as the first comparison result, then the computing unit 320 determines that the position of the conducting wire 112 is nearer to the sensing unit 150, which will be displayed on the display unit 180. When the first magnetic flux is equal to the second magnetic flux, the comparing unit 310 outputs, for example, a zero value as the first comparison result, then the computing unit 320 determines that the position of the conducting wire 112 is between the sensing unit 140 and the sensing unit 150, and in the central position inside the main body 110, which will be displayed on the display unit 180.

An operation of the proximity electric current sensing device 100 will be further described below. Firstly, users can have the conducting wire 112 go through the main body 110 through the hole 111. Then, the first magnetic flux and the second magnetic flux of the conducting wire 112 are sensed by the sensing units 140 and 150. Based on the sensed first and second magnetic flux, the processing unit 170 determines the position of the conducting wire 112 which is displayed on the display unit 180. If the position of the conducting wire 112 is nearer to the sensing unit 140, users can adjust the conducting wire 112 to the left using the adjusting component 120, so that the conducting wire 112 is moved away from the sensing unit 140 towards the sensing unit 150. If the position of the conducting wire 112 is nearer to the sensing unit 150, the users can adjust the conducting wire 112 to the right by using the adjusting component 130, so that the conducting wire 112 is moved away from the sensing unit 150 towards the sensing unit 140. By the abovementioned adjustments, the position of the conducting wire 112 will be disposed at the central position inside the main body 110.

At this point, the third magnetic flux of the conducting wire 112 is sensed by the sensing unit 160, and the sensed third magnetic flux is calculated by the processing unit 170 according to aforementioned Faraday's laws, so that the electric current flowing through the conducting wire 112 can be acquired. Thereby, the electric current of the conducting wire 112 can be measured precisely, so that a measurement error of the electric current can be reduced.

Figure 4:
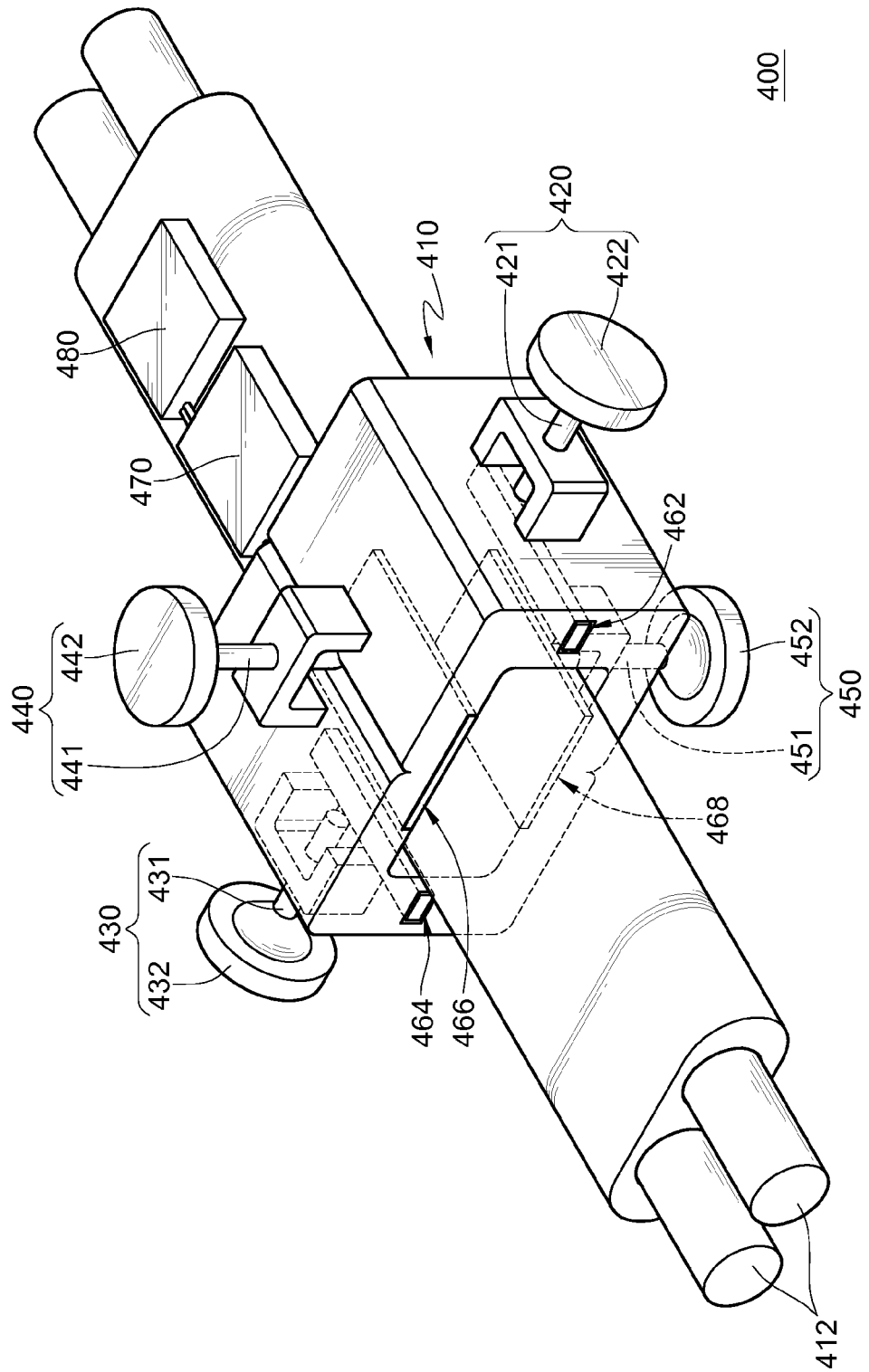
FIG. 4 is a perspective view of a proximity electric current sensing device of another embodiment of the disclosure.

The above description is an embodiment of the disclosure, and another embodiment will be described below. FIG. 4 is a diagram of a proximity electric current sensing device of another embodiment of the disclosure. A proximity electric current sensing device 400 comprises a main body 410, adjusting components 420, 430, 440 and 450, sensing units 462, 464, 466 and 468, a processing unit 470, and a display unit 480.

The main body 410 has a hole 411. The hole 411 is used for a conducting wire 412 to go through the main body 410. In other words, users can have the conducting wire 412 go through the main body 410 through the hole 411, in order to measure an amount of electric current of the conducting wire 412. In this embodiment, the conducting wire 412 is a dual core power cord.

The adjusting component 420 is disposed on a first side of the main body 410 for adjusting a first position of the conducting wire 412. The adjusting component 430 is disposed on a second side of the main body 410 for adjusting a second position of the conducting wire 412. In this embodiment, the adjusting component 420 includes a bar 421 and a knob 422. The knob 422 is connected to the bar 421, and the bar 421 performs a reciprocating motion by turning the knob 422, so that the bar 421 can be inserted into or out of the main body 410.

Furthermore, the adjusting component 430 includes a bar 431 and a knob 432. The knob 432 is connected to the bar 431, and the bar 431 performs a reciprocating motion by turning the knob 432, so that the bar 431 can be inserted into or out of the main body 410. Operations of the adjusting components 420 and 430 can be referred to the embodiment of the adjusting components 120 and 130 as shown in FIG. 1, which will not be mentioned herein again.

The adjusting component 440 is disposed on a third side of the main body 410 for adjusting a third position of the conducting wire 412. The adjusting component 450 is disposed on a fourth side of the main body 410 for adjusting a fourth position of the conducting wire 412. In this embodiment, the adjusting component 440 includes a bar 441 and a knob 442. The knob 442 is connected to the bar 441, and the bar 441 performs a reciprocating motion by turning the knob 442, so that the bar 441 can be inserted into or out of the main body 410.

Furthermore, the adjusting component 450 includes a bar 451 and a knob 452. The knob 452 is connected to the bar 451, and the bar 451 performs a reciprocating motion by turning the knob 452, so that the bar 451 can be inserted into or out of the main body 410. Thereby, users can adjust the conducting wire 412 to move upward or downward vertically by turning the knobs 442 or 452, so that the conducting wire 412 can be adjusted to be disposed at a central position inside the main body 410 for measuring the amount of electric current of the conducting wire 412.

The sensing unit 462 is disposed on the main body 410 and adjacent to a first side of the conducting wire 412 for sensing a first magnetic flux of the conducting wire 412. The first magnetic flux sensed by the sensing unit 462 has a larger intensity if the conducting wire 412 is disposed nearer to the sensing unit 462. On the contrary, the first magnetic flux sensed by the sensing unit 462 has a smaller intensity if the conducting wire 412 is disposed further from the sensing unit 462.

The sensing unit 464 is disposed on the main body 410 and adjacent to a second side of the conducting wire 412 for sensing a second magnetic flux of the conducting wire 412. The second magnetic flux sensed by the sensing unit 464 has a larger intensity if the conducting wire 412 is disposed nearer to the sensing unit 464. On the contrary, the second magnetic flux sensed by the sensing unit 464 has a smaller intensity if the conducting wire 412 is disposed further from the sensing unit 464.

The sensing unit 466 is disposed on the main body 410 and adjacent to a third side of the conducting wire 412 for sensing a third magnetic flux of the conducting wire 412. The third magnetic flux sensed by the sensing unit 466 has a larger intensity if the conducting wire 412 is disposed nearer to the sensing unit 466. On the contrary, the third magnetic flux sensed by the sensing unit 466 has a smaller intensity if the conducting wire 412 is disposed further from the sensing unit 466.

The sensing unit 468 is disposed on the main body 410 and adjacent to a fourth side of the conducting wire 412 for sensing a fourth magnetic flux of the conducting wire 412. The fourth magnetic flux sensed by the sensing unit 468 has a larger intensity if the conducting wire 412 is disposed nearer to the sensing unit 468. On the contrary, the fourth magnetic flux sensed by the sensing unit 468 has a smaller intensity if the conducting wire 412 is disposed further from the sensing unit 468.

The processing unit 470 is coupled to the sensing units 462, 464, 466 and 468 for determining a position (e.g. a horizontal position) of the conducting wire 412 according to the first magnetic flux and the second magnetic flux and determining another position (e.g. a vertical position) of the conducting wire 412 according to the third magnetic flux and the fourth magnetic flux, and calculating an amount of electric current flowing through the conducting wire 412 according to the third magnetic flux.

Accordingly, users can know if the position of the conducting wire 412 is offset according to the position (i.e. the horizontal position) and the other position (i.e. the vertical position) of the conducting wire 412 displayed by the display unit 480. Then, the position of the conducting wire 412 is adjusted by using the adjusting components 420, 430, 440 and 450 to ensure that the conducting wire 412 is at the central position inside the main body 410, so that a measurement error of electric current can be reduced.

Figure 5:
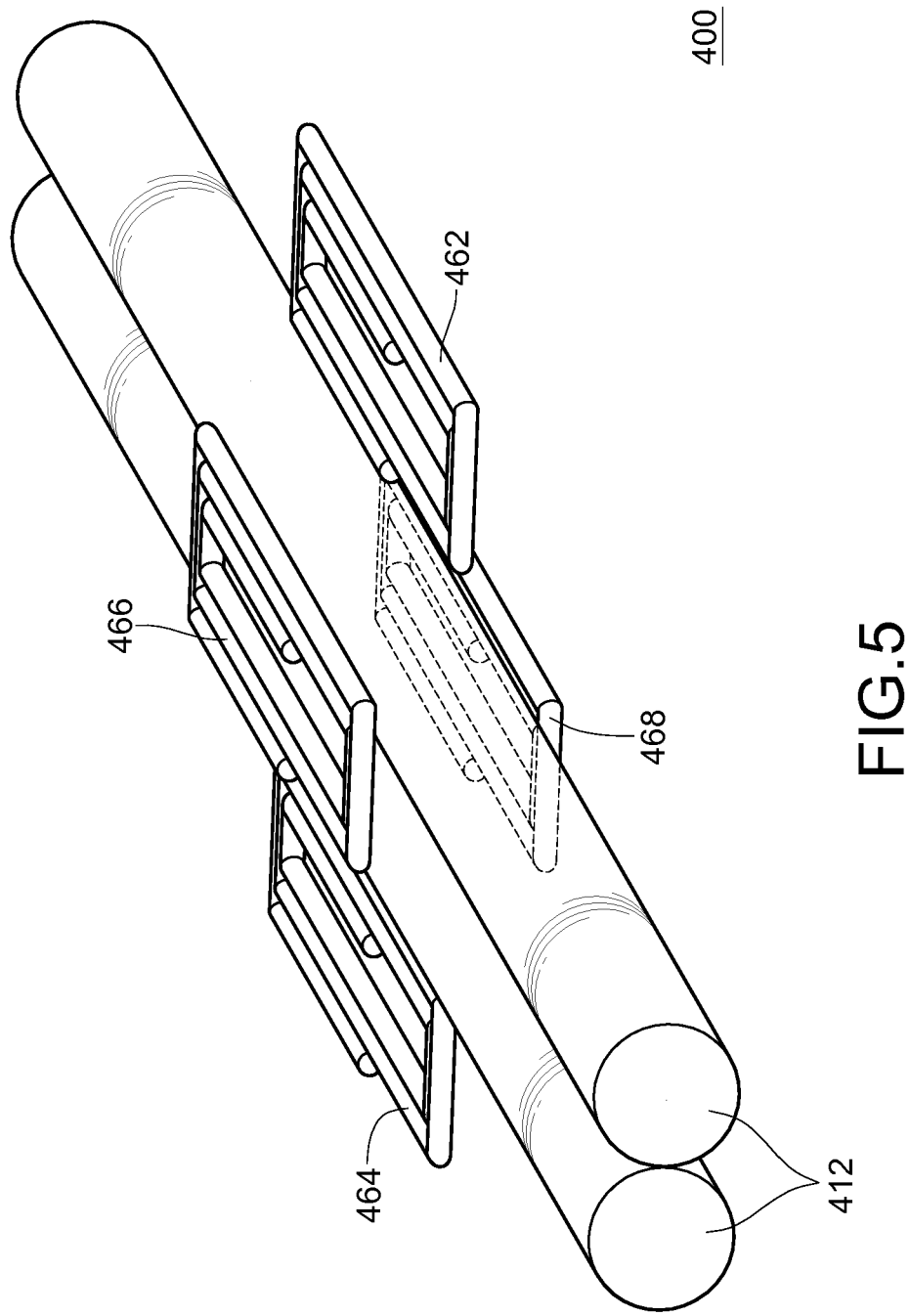
FIG. 5 is an illustration of a disposition of sensing units 462, 464, 466 and 468 of the disclosure.

FIG. 5 illustrates a disposition of the sensing units 462, 464, 466 and 468 of the disclosure. The sensing units 462, 464, 466 and 468 can be sensing coils. Because the conducting wire 412 is at the central position inside the main body 410, a distance g between the sensing coil 466 and the conducting wire 412 is half a height of the main body 410. Therefore, by sensing the electric current of the conducting wire 412 via the sensing unit 466 in this embodiment, an induced voltage can be acquired as follows:

$$\text{emf}(v) = -\sum_{n=1}^{N} \frac{d\Phi_n}{dt} = \frac{\omega\mu_0 I \sin\omega t}{2\pi} \sum_{n=1}^{N} c_n \ln\left(\frac{b_n^2 + g^2}{a_n^2 + g^2}\right)$$

Wherein, parameters $a_n$, $b_n$, $c_n$, N, g are known parameters, while I is an unknown number. Therefore, the value of I can be acquired based on the abovementioned equation, so that the amount of the electric current of the conducting wire 412 can be precisely sensed by the proximity electric current sensing device 400 of this embodiment.

Figure 6:
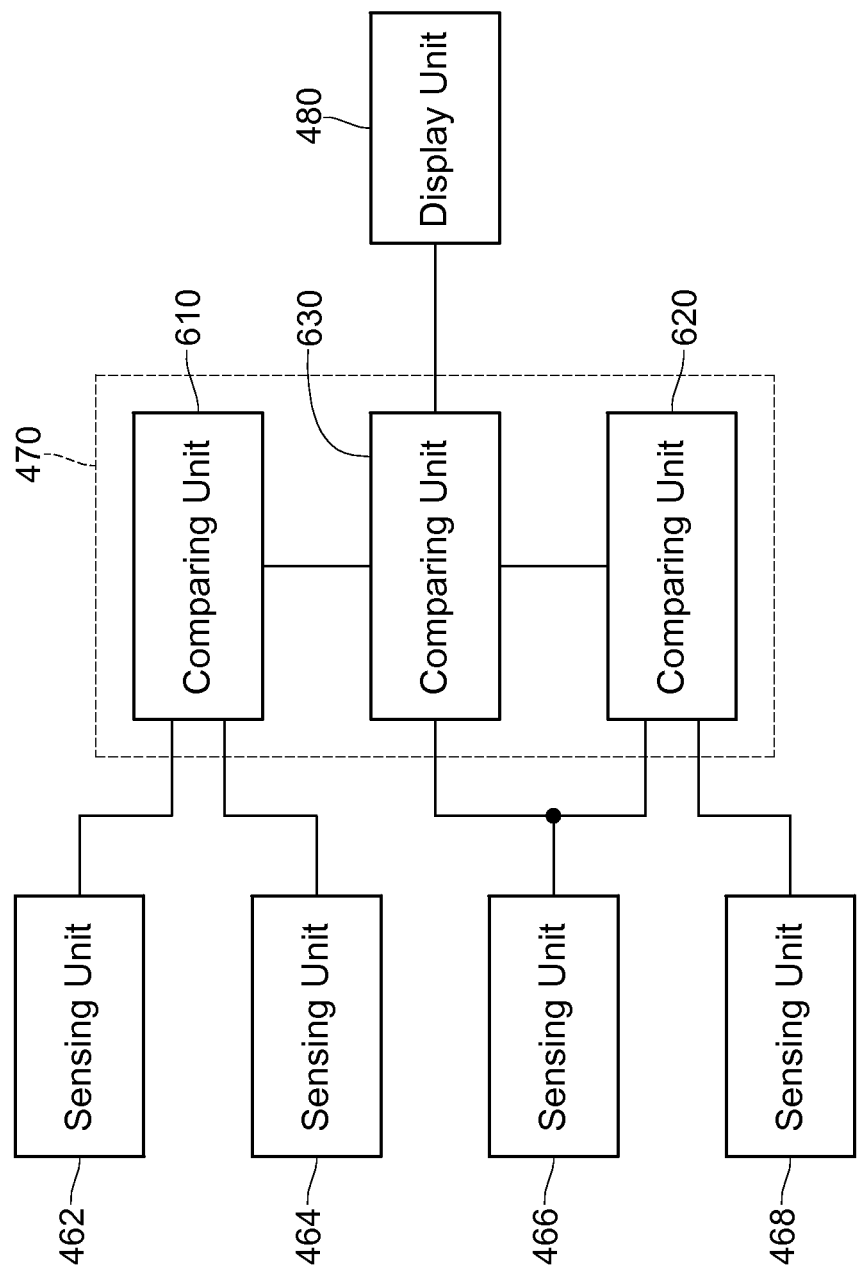
FIG. 6 is a block diagram of a circuit of a proximity electric current sensing device of another embodiment of the disclosure.

FIG. 6 is a block diagram of a circuit of a proximity electric current sensing device of another embodiment of the disclosure. The proximity electric current sensing device 400 comprises the sensing units 462, 464, 466 and 468, the processing unit 470, and the display unit 480. Their relationships of coupling can be referred to FIG. 6, which will not be mentioned again herein. The processing unit 470 includes comparing units 610 and 620, and a computing unit 630. The comparing unit 610 is coupled to the sensing units 462 and 464 for receiving and comparing the first magnetic flux and the second magnetic flux in order to generate a second comparison result. The comparing unit 620 is coupled to the sensing units 466 and 468 for receiving and comparing the third magnetic flux and the fourth magnetic flux in order to generate a third comparison result. The computing unit 630 is coupled to the comparing units 610 and 620, and the sensing unit 466 for determining the position of the conducting wire 412 according to the second comparison result, determining the other position of the conducting wire 412 according to the third comparison result, and calculating the amount of electric current flowed through the conducting wire 412 according to the third magnetic flux.

For example, when the first magnetic flux is larger than the second magnetic flux, the comparing unit 610 outputs, for example, a positive value as the second comparison result, then the computing unit 630 determines that the position of the conducting wire 412 is nearer to the sensing unit 462, which will be displayed on the display unit 480. When the first magnetic flux is smaller than the second magnetic flux, the comparing unit 610 outputs, for example, a negative value as the second comparison result, then the computing unit 630 determines that the position of the conducting wire 412 is nearer to the sensing unit 464, which will be displayed on the display unit 480. When the first magnetic flux is equal to the second magnetic flux, the comparing unit 610 outputs, for example, a zero value as the second comparison result, then the computing unit 630 calculates that the position of the conducting wire 412 is between the sensing unit 462 and the sensing unit 464, i.e., the central horizontal position inside the main body 410, which will be displayed on the display unit 480.

When the third magnetic flux is larger than the fourth magnetic flux, the comparing unit 620 outputs, for example, a positive value as the third comparison result, then the computing unit 630 determines that the position of the conducting wire 412 is nearer to the sensing unit 466, which will be displayed on the display unit 480. When the third magnetic flux is smaller than the fourth magnetic flux, the comparing unit 620 outputs, for example, a negative value as the third comparison result, then the computing unit 630 determines that the position of the conducting wire 412 is nearer to the sensing unit 468, which will be displayed on the display unit 480. When the third magnetic flux is equal to the fourth magnetic flux, the comparing unit 620 outputs, for example, a zero value as the third comparison result, then the computing unit 630 calculates that the position of the conducting wire 412 is between the sensing unit 466 and the sensing unit 468, i.e., the central vertical position inside the main body 410, which will be displayed on the display unit 480.

An operation of the proximity electric current sensing device 400 will be further described below. Firstly, users can have the conducting wire 412 go through the main body 410 through the hole 411. Then, the first magnetic flux and the second magnetic flux of the conducting wire 412 are sensed by the sensing units 462 and 464, and the third magnetic flux and the fourth magnetic flux of the conducting wire 412 are sensed by the sensing units 466 and 468. Based on the sensed first, second, third, and fourth magnetic flux, the processing unit 470 determines the position of the conducting wire 412, which is displayed on the display unit 480. If the position of the conducting wire 412 is nearer to the sensing unit 462, users can adjust the conducting wire 412 to the left by using the adjusting component 420, so that the conducting wire 412 is moved away from the sensing unit 462 towards the sensing unit 464. If the position of the conducting wire 412 is nearer to the sensing unit 464, the users can adjust the conducting wire 412 to the right by using the adjusting component 430, so that the conducting wire 412 is moved away from the sensing unit 464 towards the sensing unit 462. By the abovementioned adjustments, the position of the conducting wire 412 will be disposed at the central horizontal position inside the main body 410.

Furthermore, if the position of the conducting wire 412 is nearer to the sensing unit 466, users can adjust the conducting wire 412 to the left by using the adjusting component 440, so that the conducting wire 412 is moved away from the sensing unit 466 towards the sensing unit 468. If the position of the conducting wire 412 is nearer to the sensing unit 468, the users can adjust the conducting wire 412 to the right by using the adjusting component 450, so that the conducting wire 412 is moved away from the sensing unit 468 towards the sensing unit 466. By the abovementioned adjustments, the position of the conducting wire 412 will be disposed at the central vertical position inside the main body 410.

At this point, the third magnetic flux of the conducting wire 412 is sensed by the sensing unit 466, and the third magnetic flux is calculated by the processing unit 470 according to aforementioned Faraday's laws, so that the electric current flowing through the conducting wire 412 can be acquired. Thereby, the electric current of the conducting wire 412 can be measured precisely, so that a measurement error of the electric current can be reduced.

Figure 7:
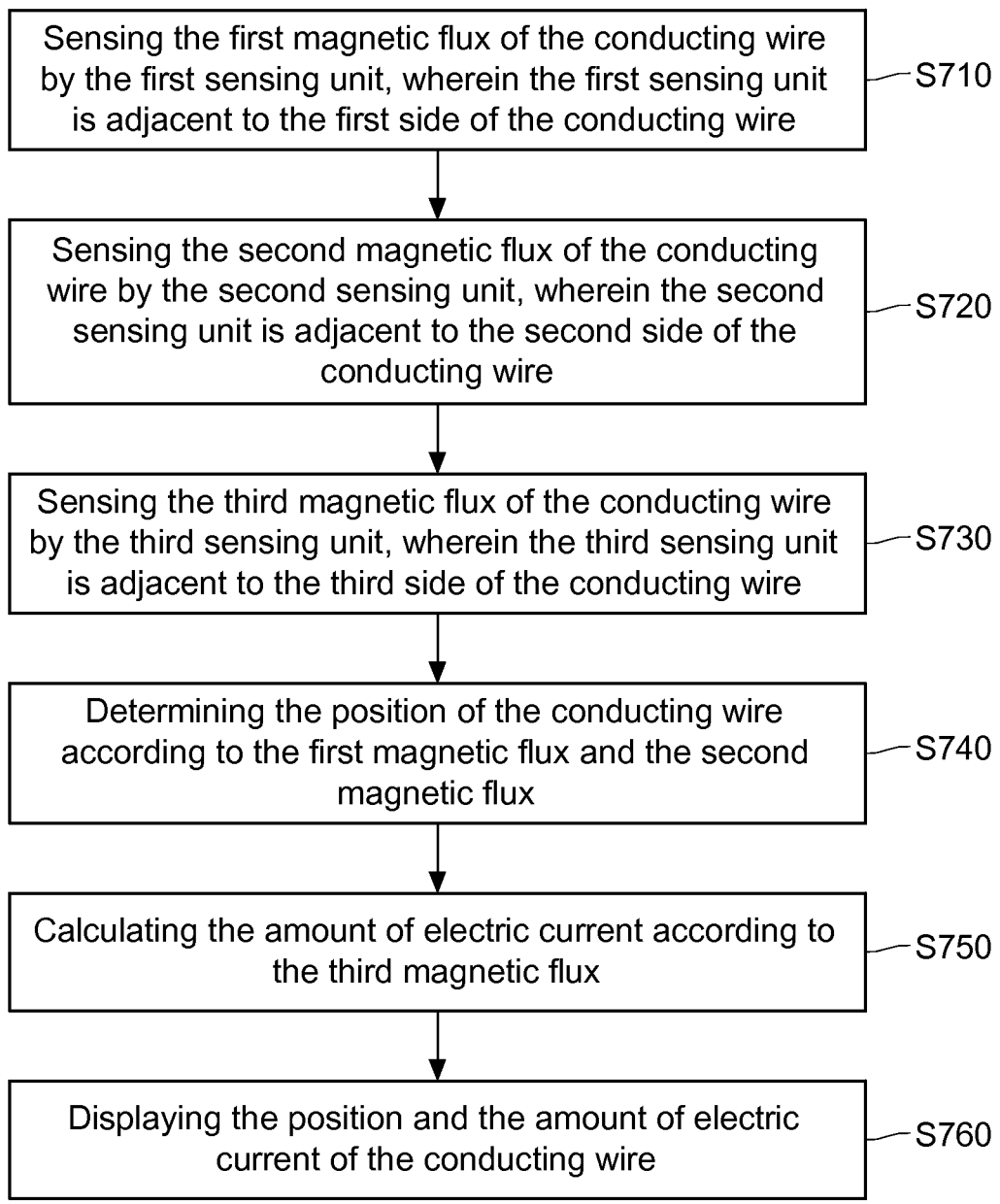
FIG. 7 is a flow chart of a proximity electric current sensing method of the disclosure.

According to the description of the embodiment of FIG. 1, a proximity electric current sensing method can be concluded. FIG. 7 is a flow chart of a proximity electric current sensing method of the disclosure. In the step S710, the first magnetic flux of the conducting wire is sensed by the first sensing unit, wherein the first sensing unit is adjacent to the first side of the conducting wire. In the step S720, the second magnetic flux of the conducting wire is sensed by the second sensing unit, wherein the second sensing unit is adjacent to the second side of the conducting wire. In the step S730, the third magnetic flux of the conducting wire is sensed by the third sensing unit, wherein the third sensing unit is adjacent to the third side of the conducting wire. In the step S740, the position of the conducting wire is determined according to the first magnetic flux and the second magnetic flux. In the step S750, the amount of electric current is calculated according to the third magnetic flux. In the step S760, the position and the amount of electric current of the conducting wire is displayed. Thereby, users can know if the position of the conducting wire is offset inside the main body according to the position (e.g. horizontal position) of the conducting wire displayed.

The step S740 further includes the following steps: comparing the first magnetic flux and the second magnetic flux in order to generate the first comparison result, and then determining the position of the conducting wire according to the first comparison result.

Figure 8:
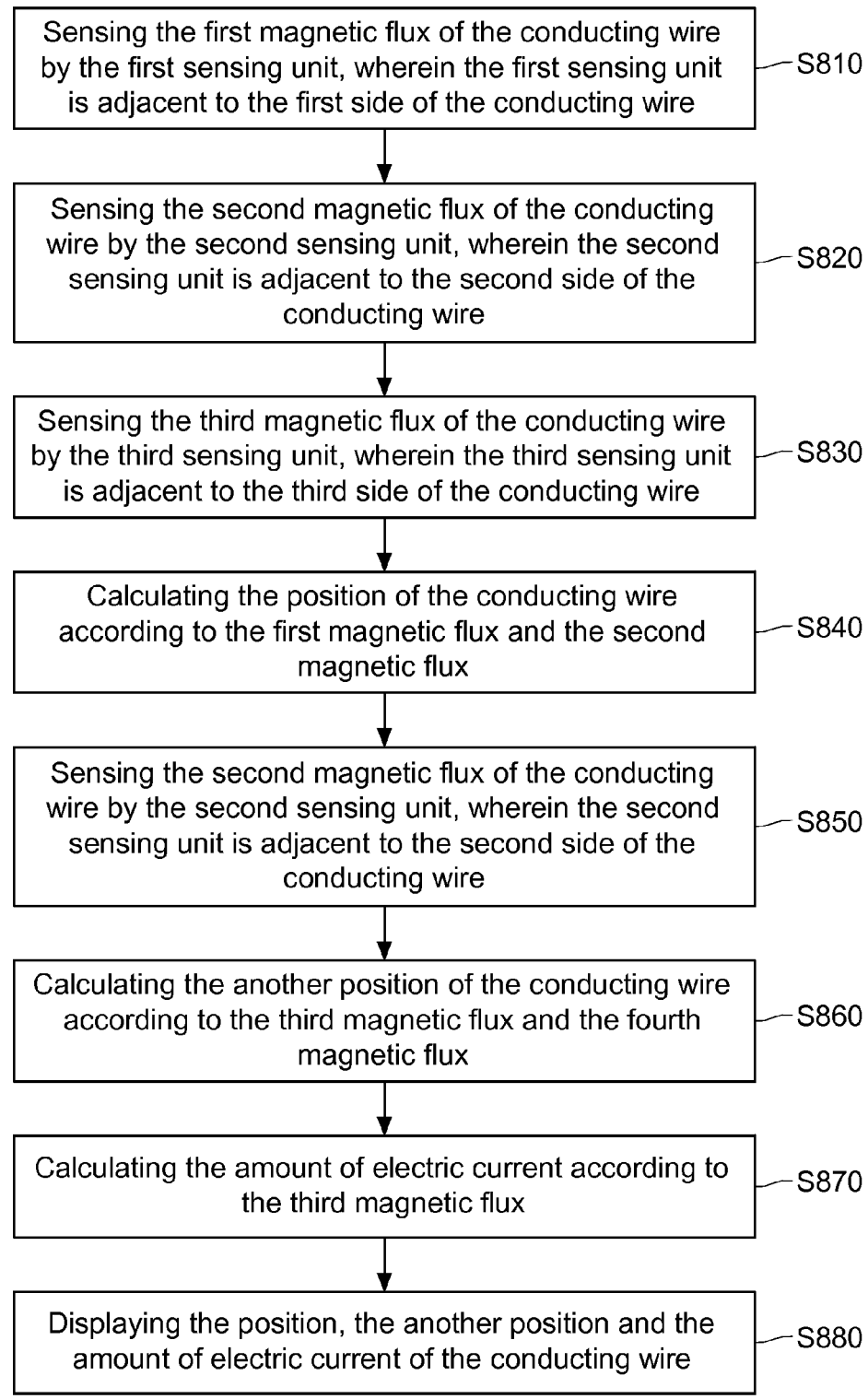
FIG. 8 is a flow chart of another proximity electric current sensing method of the disclosure.

According to the description of the embodiment of FIG. 4, a proximity electric current sensing method can be concluded. FIG. 8 is a flow chart of a proximity electric current sensing method of the disclosure. In the step S810, the first magnetic flux of the conducting wire is sensed by the first sensing unit, wherein the first sensing unit is adjacent to the first side of the conducting wire. In the step S820, the second magnetic flux of the conducting wire is sensed by the second sensing unit, wherein the second sensing unit is adjacent to the second side of the conducting wire. In the step S830, the third magnetic flux of the conducting wire is sensed by the third sensing unit, wherein the third sensing unit is adjacent to the third side of the conducting wire. In the step S840, the position of the conducting wire is determined according to the first magnetic flux and the second magnetic flux.

In the step S850, the fourth magnetic flux of the conducting wire is sensed by the fourth sensing unit, wherein the fourth sensing unit is adjacent to the fourth side of the conducting wire. In the step S860, another position of the conducting wire is determined according to the third magnetic flux and the fourth magnetic flux. In the step S870, the amount of electric current is calculated according to the third magnetic flux. In the step S880, the position, the another position, and the amount of electric current of the conducting wire are displayed. Thereby, users can know if the position of the conducting wire is offset inside the main body according to the displayed position (e.g. horizontal position) and the another position (e.g. vertical position) of the conducting wire.

The step S840 further includes the following steps: comparing the first magnetic flux and the second magnetic flux in order to generate the second comparison result, and then determining the position of the conducting wire according to the second comparison result. The step S860 further includes the following steps: comparing the third magnetic flux and the fourth magnetic flux in order to generate the third comparison result, and determining another position of the conducting wire according to the third comparison result.

According to a proximity electric current sensing device and method of the embodiment of the disclosure, the magnetic flux of the conducting wire is sensed by the sensing units (the first sensing unit and the second sensing unit; the first to the fourth sensing units), in order to ensure if the position of the conducting wire is at the central position inside the main body of the electric current sensing device. If it is not, the position of the conducting wire is adjusted by the adjusting components (the first adjusting component and the second adjusting component; the first to the fourth adjusting components), so that the conducting wire is at the central position inside the main body of the electric current sensing device, and the amount of electric current flowing through the conducting wire is calculated by sensing the magnetic flux of the conducting wire via the third sensing unit. Thereby, a measurement error of electric current can be reduced effectively.

Note that the specifications relating to the above embodiments should be construed as exemplary rather than as limitative of the disclosure, with many variations and modifications being readily attainable by a person of average skill in the art without departing from the spirit or scope thereof as defined by the appended claims and their legal equivalents.

What is claimed is:
1. A proximity electric current sensing device, comprising:
a main body having a hole for a conducting wire to go through the main body;
a first adjusting component disposed on a first side of the main body for adjusting a first position of the conducting wire;
a second adjusting component disposed on a second side of the main body for adjusting a second position of the conducting wire;
a first sensing unit disposed on the main body and adjacent to a first side of the conducting wire for sensing a first magnetic flux of the conducting wire;
a second sensing unit disposed on the main body and adjacent to a second side of the conducting wire for sensing a second magnetic flux of the conducting wire;
a third sensing unit disposed on the main body and adjacent to a third side of the conducting wire for sensing a third magnetic flux of the conducting wire;
a processing unit coupled to the first sensing unit, the second sensing unit and the third sensing unit being configured to determine a position of the conducting wire according to the first magnetic flux and the second magnetic flux, and to calculate an amount of an electric current according to the third magnetic flux;
a third adjusting component disposed on a third side of the main body for adjusting a third position of the conducting wire;
a fourth adjusting component disposed on a fourth side of the main body for adjusting a fourth position of the conducting wire; and a fourth sensing unit disposed on the main body and adjacent to a fourth side of the conducting wire for sensing a fourth magnetic flux of the conducting wire;

wherein the processing unit is further coupled to the fourth sensing unit for determining another position of the conducting wire according to the third magnetic flux and fourth magnetic flux.

2. The proximity electric current sensing device as claimed in claim 1, wherein the third sensing unit includes:
a first sensing coil disposed on the main body and adjacent to the third side of the conducting wire; and
a second sensing coil disposed on the main body and adjacent to the first sensing coil at a preset distance.

3. The proximity electric current sensing device as claimed in claim 1, wherein the processing unit includes:
a first comparing unit coupled to the first sensing unit and the second sensing unit for receiving and comparing the first magnetic flux and the second magnetic flux for generating a first comparison result; and
a first computing unit coupled to the first comparing unit and the third sensing unit for determining the position of the conducting wire according to the first comparison result, and calculating the amount of the electric current according to the third magnetic flux.

4. The proximity electric current sensing device as claimed in claim 1, wherein the processing unit includes:
a second comparing unit coupled to the first sensing unit and the second sensing unit for receiving and comparing the first magnetic flux and the second magnetic flux for generating a second comparison result;
a third comparing unit coupled to the third sensing unit and the fourth sensing unit for receiving and comparing the third magnetic flux and the fourth magnetic flux for generating a third comparison result; and
a second computing unit coupled to the second comparing unit, the third comparing unit and the third sensing unit being configured to determine the position of the conducting wire according to the second comparison result, to determine another position of the conducting wire according to the third comparison result, and to calculate the amount of the electric current according to the third magnetic flux.

5. The proximity electric current sensing device as claimed in claim 1, wherein the first adjusting component, the second adjusting component, the third adjusting component and the fourth adjusting component respectively includes:
a first bar; and
a first knob connected to the first bar, and the first bar being configured to perform a reciprocating motion by turning the first knob, so that the first bar is capable of being inserted into or out of the main body.

6. The proximity electric current sensing device as claimed in claim 1, further comprising:
a first display unit coupled to the processing unit for displaying the position, the another position, and the amount of the electric current of the conducting wire.

7. The proximity electric current sensing device as claimed in claim 1, wherein the conducting wire is a dual core power cord.

8. The proximity electric current sensing device as claimed in claim 1, wherein the first adjusting component and the second adjusting component respectively includes:
a second bar; and
a second knob connected to the second bar, and the second bar being configured to perform a reciprocating motion by turning the second knob, so that the second bar is capable of being inserted into or out of the main body.

9. The proximity electric current sensing device as claimed in claim 1, further comprising:
a display unit coupled to the processing unit for displaying the position and the amount of the electric current of the conducting wire.

10. A proximity electric current sensing method, comprising:
using a first sensing unit for sensing a first magnetic flux of a conducting wire, wherein the first sensing unit being adjacent to a first side of the conducting wire;
using a second sensing unit for sensing a second magnetic flux of the conducting wire, the second sensing unit being adjacent to a second side of the conducting wire;
using a third sensing unit for sensing a third magnetic flux of the conducting wire, the third sensing unit being adjacent to a third side of the conducting wire, the third sensing unit comprising a first sensing coil disposed adjacent to the third side of the conducting wire; and a second sensing coil disposed adjacent to the first sensing coil at a preset distance;
determining a position of the conducting wire according to the first magnetic flux and the second magnetic flux, wherein determining the position of the conducting wire comprises:
comparing the first magnetic flux and the second magnetic flux in order for generating a first comparison result; and
determining the position of the conducting wire according to the first comparison result; and
calculating an amount of an electric current according to the third magnetic flux.

11. The proximity electric current sensing method as claimed in claim 10, further including:
using a fourth sensing unit for sensing a fourth magnetic flux of the conducting wire, the fourth sensing unit being adjacent to a fourth side of the conducting wire; and
determining another position of the conducting wire according to the third magnetic flux and the fourth magnetic flux.

12. The proximity electric current sensing method as claimed in claim 11, wherein the step of calculating a position of the conducting wire according to the first magnetic flux and the second magnetic flux includes:
comparing the first magnetic flux and the second magnetic flux for generating a second comparison result; and
determining the position of the conducting wire according to the second comparison result.

13. The proximity electric current sensing method as claimed in claim 11, wherein the step of determining another position of the conducting wire according to the third magnetic flux and the fourth magnetic flux includes:
comparing the third magnetic flux and the fourth magnetic flux for generating a third comparison result; and
determining the another position of the conducting wire according to the third comparison result.

14. The proximity electric current sensing method as claimed in claim 11, further comprising:
displaying the position, the another position and the amount of the electric current of the conducting wire.

15. The proximity electric current sensing method as claimed in claim 10, further comprising:
displaying the position and the amount of the electric current of the conducting wire.

* * * * *